(12) United States Patent
Swoboda

(10) Patent No.: US 7,519,111 B2
(45) Date of Patent: Apr. 14, 2009

(54) APPARATUS AND METHOD FOR PROVIDING SYSTEM AND TEST CLOCK SIGNALS TO AN INTEGRATED CIRCUIT ON A SINGLE PIN

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 557 days.

(21) Appl. No.: 11/080,699

(22) Filed: Mar. 15, 2005

(65) Prior Publication Data
US 2005/0218920 A1 Oct. 6, 2005

Related U.S. Application Data

(60) Provisional application No. 60/553,081, filed on Mar. 15, 2004.

(51) Int. Cl.
*H04Q 1/20* (2006.01)
(52) U.S. Cl. .................. 375/224; 375/376; 375/225; 375/377
(58) Field of Classification Search ............... 375/224, 375/225
See application file for complete search history.

(56) References Cited

U.S. PATENT DOCUMENTS

| | | | | |
|---|---|---|---|---|
| 6,263,460 B1 * | 7/2001 | Spilo et al. | ................. | 714/718 |
| 6,639,422 B1 * | 10/2003 | Albean | ........................ | 326/16 |
| 6,671,848 B1 * | 12/2003 | Mulig et al. | ................ | 714/744 |
| 6,922,075 B1 * | 7/2005 | Morley | ........................ | 326/30 |
| 7,007,188 B1 * | 2/2006 | Tischler et al. | .............. | 713/501 |
| 7,017,094 B2 * | 3/2006 | Correale et al. | ............. | 714/733 |
| 7,034,599 B1 * | 4/2006 | Agrawal et al. | ............. | 327/291 |
| 7,114,113 B2 * | 9/2006 | Yonaga et al. | .............. | 714/744 |
| 2003/0009714 A1 * | 1/2003 | Evans | ......................... | 714/726 |
| 2003/0184384 A1 * | 10/2003 | Orr et al. | ..................... | 330/286 |
| 2004/0260992 A1 * | 12/2004 | Nishida et al. | .............. | 714/742 |
| 2005/0024118 A1 * | 2/2005 | Agrawal et al. | ............. | 327/291 |

* cited by examiner

*Primary Examiner*—Shuwang Liu
*Assistant Examiner*—Kenneth Lam
(74) *Attorney, Agent, or Firm*—Frederick J. Telecky, Jr.; Wade J. Brady, III

(57) ABSTRACT

In a configuration testing integrated circuits, the system clock signals are forced to the same frequency as the test clock signals. When the test clock signals and the system clock signals have the same frequency, both clock signals can applied to the integrated circuit through a single terminal, whereby providing a terminal for the exchange of other signals with the integrated circuit. Using the same signals for test and system clocks allows selected components to be eliminated.

11 Claims, 2 Drawing Sheets

APPARATUS AND METHOD FOR PROVIDING SYSTEM AND TEST CLOCK SIGNALS TO AN INTEGRATED CIRCUIT ON A SINGLE PIN

This application claims priority under 35 USC §119(e) (1) of Provisional Application No. 60/553,081 filed Mar. 15, 2004.

BACKGROUND OF THE INVENTION

1. Field of the Invention

This invention relates generally to data processing systems and, more particularly, to the testing of integrated circuits.

2. Background of the Invention

As the number of components and the complexity of integrated circuits have increased, the importance of testing these integrated circuits has increased. The importance of testing has become so great that many components in a circuit are now dedicated to the testing (and program debug) involving these circuits. Concurrently, integrated circuits have continually been reduced in size. One of the most important consequences of this size reduction, along with the increased complexity and functionality of the integrated circuit, has been the problem of providing the necessary electrical connections between the integrated circuit and the components not fabricated in the circuit. The testing and program debug associated with the testing of the integrated circuit requires additional terminals. For example, the common Joint Test Action Group (JTAG) boundary scan interface procedure requires up to five terminals to accomplish the specified test procedure.

Referring to FIG. 1A, a system for providing system and test clock signals to a processor core (or any integrated circuit) 101 under test. An oscillator unit 11 supplies a periodic signal to the input terminals of amplifier unit 171 and amplifier unit 172, both of buffer unit 17. The output terminal of amplifier 171 applies a signal to the phase locked loop 102. The signal applied to the phase locked loop 102 results in the phase locked loop providing a system clock (SYSCLK) signal to the integrated circuit 101. The output terminal of amplifier 172 is coupled through element 16 to emulation unit 15. Element 16 is a reverse termination resistor used to compensate for "transmission line" effects. The emulation unit 15 exchanges signals with the interface logic unit 103 (typically called the TAG unit in JTAG literature). One of the signals applied to the interface logic unit from the emulation unit is the TCK (test clock) signal. The interface logic unit 103 exchanges signals with the processor core 101.

Referring to FIG. 1B, a similar block diagram is shown. In this configuration, the system clock is implemented by a crystal oscillator tank circuit 21 including an crystal oscillator 211 external to the integrated circuit 20 and an energy storage element 212 forming part of the integrated circuit 20. The crystal oscillator tank circuit 21 is activated by the oscillator unit 11 and circuit 21 applies system clock signal to the processor core 101. The other interconnections are the same for the two circuits. As will be clear, both FIG. 1A and FIG. 1B include only those components necessary to describe the invention. The configuration is more complicated than is shown in these Figs.

A need has therefore been felt for apparatus and an associated method having the feature of being able to reduce the number of terminals that provide for the interaction of external components with an integrated circuit. It would yet another feature of the apparatus and associated method to reduce the number of terminals providing the timing signals to the integrated circuit. It is yet another feature of the apparatus and associated method to provide system and test signals having the same frequency to an integrated circuit.

SUMMARY OF THE INVENTION

The foregoing and other features are accomplished, according the present invention, forcing the system clock to the same frequency as the test clock. This equality of test and system clock frequency is performed by overdriving the system clock time base. In the illustrated example the system clock time base is provided by a phase locked loop or a crystal oscillator circuit. When the test clock and the system clock are the same frequency, a single terminal can be used to supply both clock signals to the integrated circuit. In this manner, a terminal for exchanging clock signals between the integrated circuit and the external components is made available for other usage. In addition, some components that are required when both clock-signals are present can be removed.

Other features and advantages of present invention will be more clearly understood upon reading of the following description and the accompanying drawings and the claims.

BRIEF DESCRIPTION OF THE DRAWINGS

FIG. 1A is a block diagram of a configuration for testing an integrated circuit wherein the system clock signals are provided by a phase locked loop according to the prior art, while

FIG. 2A is a block diagram of a configuration for combining the test clock and system clock signals shown in FIG. 1A according to the present invention, while

DESCRIPTION OF THE PREFERRED EMBODIMENT

1. Detailed Description of the Figures

Figure 1A:
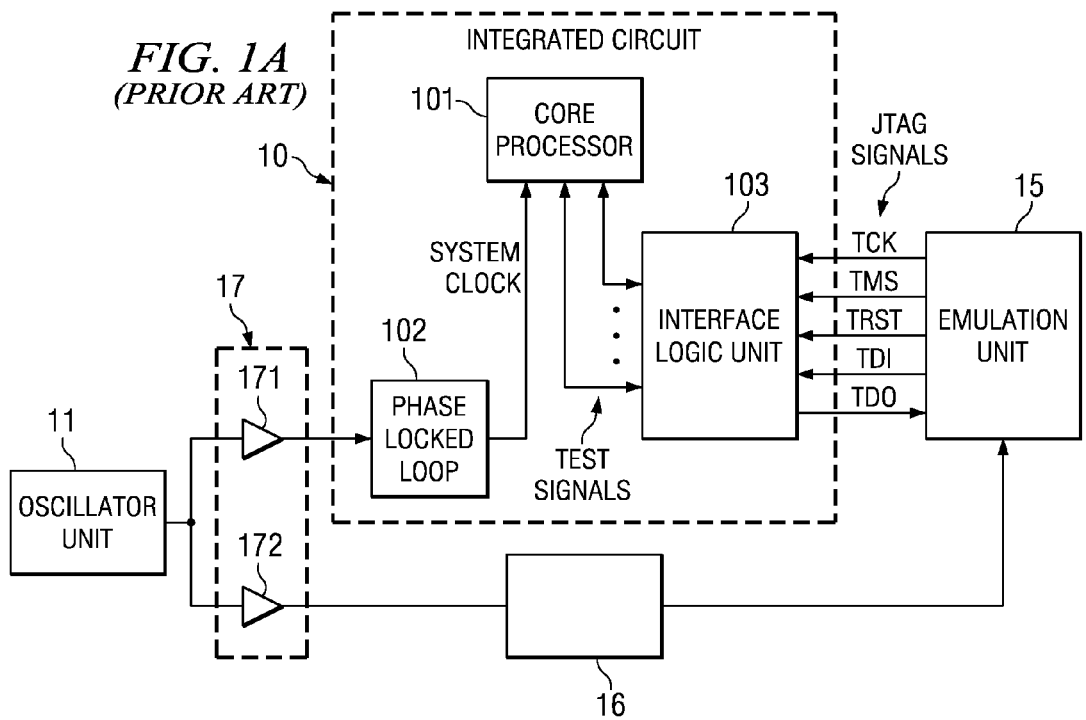
Figure 1B:
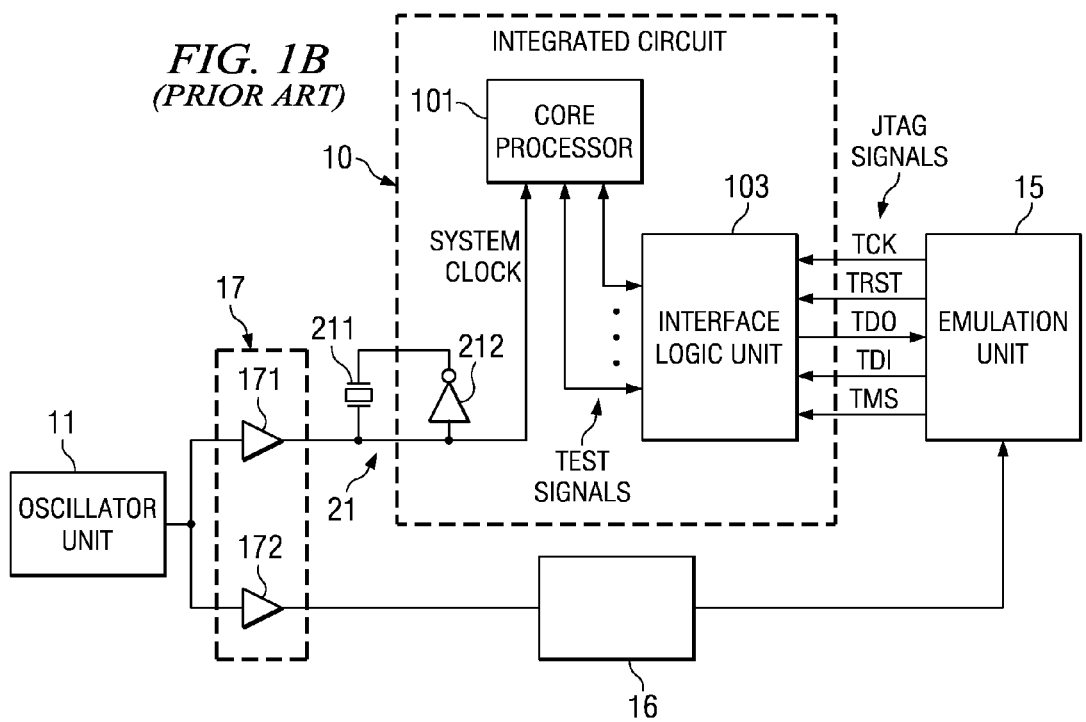
FIG. 1B is a block diagram for testing an integrated circuit wherein the system clock signals are provided by a crystal oscillator circuit according to the prior art.

FIG. 1A and FIG. 1B have been described with respect to the prior art.

Figure 2A:
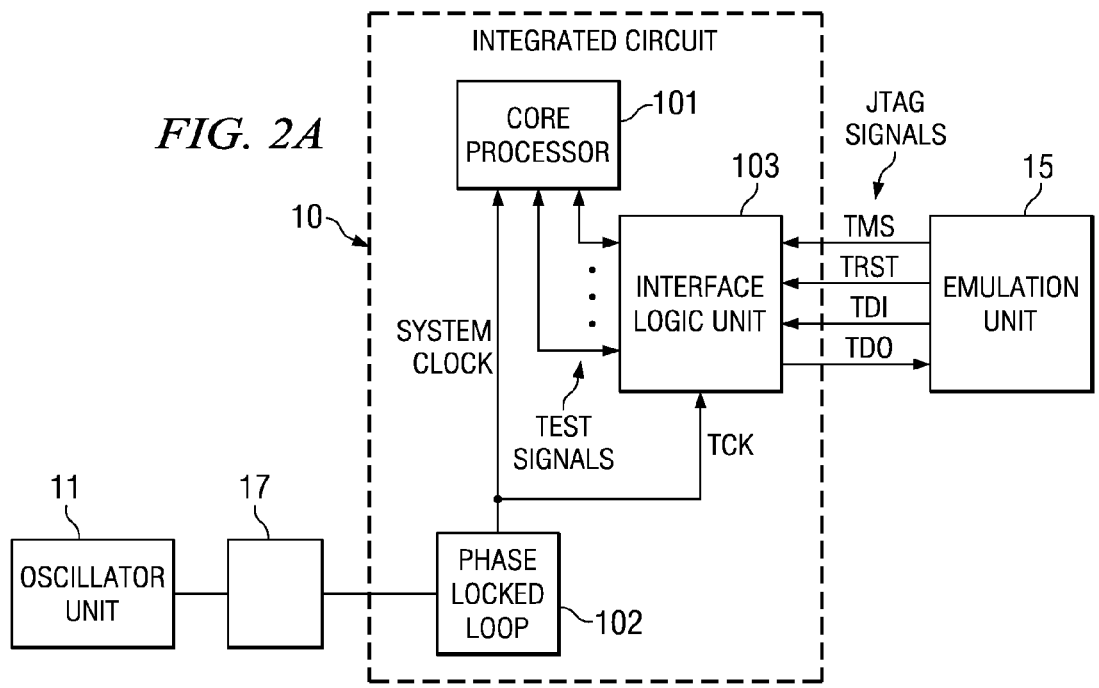

Referring to FIG. 2A, the technique for eliminating a clock terminal on an integrated circuit board including JTAG apparatus is shown. FIG. 2A is similar to FIG. 1A. However, the amplifiers 171 and 172 have been eliminated. The coupling of the oscillator unit 11 to the phase locked loop is through a reverse termination resistor 17. In addition, the connection of the oscillator unit to the emulation unit has been eliminated. The JTAG signal streams from the emulation unit no longer include the TCK signal. Instead, the phase locked loop 102 is over-driven by the oscillator unit 11. The over-driving of the phase locked loop results in the output frequency of the phase locked loop being the same frequency as the oscillator unit 11 frequency. The output signal of the phase locked loop provides the system clock and the test clock, i.e., the JTAG clock signal. Because both signals are generated by a single input signal in the configuration shown in FIG. 2A, one input terminal has been freed to be used for another signal stream.

Figure 2B:
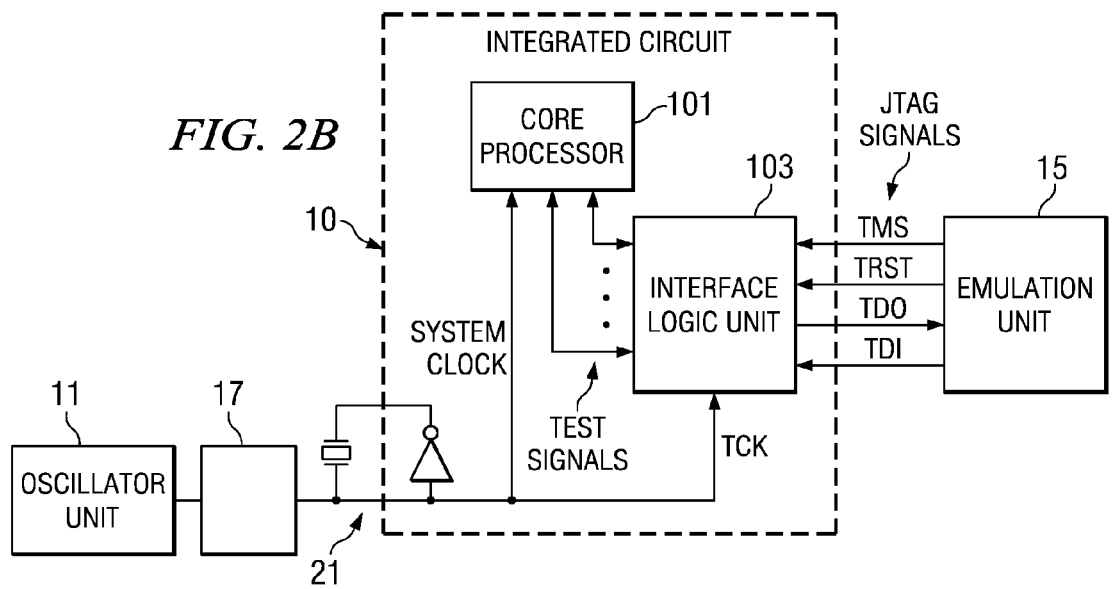
FIG. 2b is a block diagram of a configuration for combining the test clock and the system clock signals shown in FIG. 1B illustrating testing integrated circuits according to the present invention.

Similarly, in FIG. 2B, the oscillator signal is applied to the crystal oscillator circuit 21 terminal through the reverse termination resistor 17. The crystal oscillator is over-driven by the input signal from the oscillator unit. As a result of the over-driving of the crystal oscillator circuit 21, the output frequency of the crystal oscillator unit 21 has the same frequency as the input frequency. Again, the output signal of the over-driven crystal oscillator is used to provide a system clock signal for the core processor, i.e., the integrated circuit under test, and is applied to the internal logic unit to provide a test clock (TCK) signal. As with the circuit shown in FIG. 2A, the use of the oscillator unit to provide both the system clock and the test clock signal eliminates the need for the JTAG TCK data stream.

2. Operation of the Preferred Embodiment

The present invention frees an external component/integrated circuit interface terminal for other use by providing that the system clock and the test clock signals have the same frequency. This result is possible by recognizing that, during a JTAG procedure, the JTAG procedures can function when the system clock and the test clock have the same frequencies. The result is accomplished eliminating the transfer of the TCK signal from the emulation unit and coupling the TCK input to the terminal providing the system clock. The external frequency generator, an oscillator unit is shown in FIG. 1A, FIG. 1B, FIG. 2A, and FIG. 2B, provides a signal of sufficient strength to over-drive the frequency time base, i.e., the phase locked loop or a crystal oscillator unit. This over-driving of the time base is performed only during a JTAG procedure. During normal (i.e., non-JTAG procedures), the system clock can be set at the typical operating frequency determined by the time base apparatus. The elimination of the interface amplifiers 17 provides an important saving in the testing of the integrated circuit.

While this invention has been discussed with respect to testing a processor core, it will be clear that any integrated circuit with components suitable for use with the JTAG procedures can use this invention. Similarly, although this present invention has been discussed with respect to an oscillator unit providing the original frequency signal, it will be clear that any device generating an appropriate signal can be used.

While the invention has been described with respect to the embodiments set forth above, the invention is not necessarily limited to these embodiments. Accordingly, other embodiments, variations, and improvements not described herein are not necessarily excluded from the scope of the invention, the scope of the invention being defined by the following claims.

What is claimed is:

1. A method for providing timing signals for a Joint Test Action Group (JTAG) procedure in a processor test configuration, the method comprising:
over-driving a time base of a system clock during a JTAG procedure with a signal having a frequency of a JTAG test clock (TCK) corresponding to a JTAG interface logic unit; and
using the signal resulting from over-driving the time base to provide both a frequency of the system clock to a test circuit and a frequency of the JTAG test clock to the JTAG interface logic unit, wherein the frequency of the system clock and the frequency of the test clock are the same,
wherein the JTAG interface logic unit is configured to receive a JTAG test mode select (TMS) signal, a JTAG test data input (TDI) signal, and a JTAG test reset (TRST) signal from an emulation unit, to receive the TCK signal from the time base, and to provide a JTAG test data output (TDO) signal to the emulation unit, wherein the JTAG interface logic unit is not configured to receive the TCK signal from the emulation unit.

2. The method as recited in claim 1, wherein over-driving the time base further comprises:
applying the signal having the frequency of the JTAG test clock by an oscillator unit to a phase locked loop of the time base to overdrive the phase locked loop.

3. The method as recited in claim 1, wherein over-driving the time base further comprises:
applying the signal having the frequency of the JTAG test clock by an oscillator unit to a crystal oscillator circuit of the time base to overdrive the crystal oscillator circuit.

4. An integrated circuit for providing timing signals for a Joint Test Action Group (JTAG) procedure, the integrated circuit comprising:
a JTAG interface logic unit configured to receive a JTAG test mode select (TMS) signal, a JTAG test data input (TDI) signal, and a JTAG test reset (TRST) signal from an emulation unit, to receive a JTAG test clock (TCK) signal from a time base, and to provide a JTAG test data output (TDO) signal to the emulation unit, wherein the JTAG interface logic unit is not configured to receive the TCK signal from the emulation unit;
a test circuit configured to exchange signals with the JTAG interface logic unit; and
the time base configured to provide an output signal that applies both a system clock signal to the test circuit and the TCK signal to the JTAG interface logic unit when the time base is over-driven during a JTAG procedure to provide a frequency of the test clock, wherein the system clock signal and the TCK signal have a same frequency.

5. The integrated circuit as recited in claim 4, wherein the time base is further configured to receive the frequency of the test clock from an oscillation unit, wherein a phase locked loop of the time base is over-driven to provide the output signal.

6. The integrated circuit as recited in claim 4, wherein the time base includes a tank circuit coupled to an external crystal oscillator, wherein the time base is further configured to receive the frequency of the test clock from the external crystal oscillator, wherein the tank circuit is over-driven to provide the output signal.

7. A test system for providing timing signals for a Joint Test Action Group (JTAG) procedure, the test system comprising:
a test circuit;
a JTAG interface logic unit configured to receive a JTAG test mode select (TMS) signal, a JTAG test data input (TDI) signal, and a JTAG test reset (TRST) signal from an emulation unit and to exchange test signals with the test circuit;
the emulation unit configured to receive a JTAG test data output (TDO) signal from the JTAG interface logic unit, wherein the emulation unit is not configured to provide a JTAG test clock (TCK) signal to the JTAG interface logic unit; and
a time base configured to provide an output signal that applies both a system clock signal to the test circuit and a TCK signal to the JTAG interface logic unit during a JTAG procedure, wherein the system clock signal and the TCK signal have a same frequency.

8. The test system as recited in claim 7, further comprising:
an oscillator unit, wherein the time base is further configured to be over-driven by the oscillator unit to provide the output signal.

9. The test system as recited in claim 8, wherein the time base is a phase locked loop.

10. The test system as recited in claim 8, wherein the time base is a crystal oscillator unit.

11. The test system recited in claim 8, further comprising:
a reverse termination resistor coupled between the oscillator unit and the time base.

* * * * *